(12) United States Patent
Ivanov

(10) Patent No.: US 6,366,169 B1
(45) Date of Patent: Apr. 2, 2002

(54) FAST RAIL-TO-RAIL CLASS AB OUTPUT STAGE HAVING STABLE OUTPUT BIAS CURRENT AND LINEAR PERFORMANCE

(75) Inventor: Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/527,695

(22) Filed: Mar. 16, 2000

(51) Int. Cl.[7] .............................................. H03F 3/45
(52) U.S. Cl. ..................................... 330/255; 330/260
(58) Field of Search ............................ 330/255, 260, 330/264, 265, 267

(56) References Cited

U.S. PATENT DOCUMENTS

| | | | |
|---|---|---|---|
| 4,570,128 A | | 2/1986 | Monticelli .................. 330/267 |
| 5,182,525 A | * | 1/1993 | Theus ......................... 330/253 |
| 5,311,145 A | | 5/1994 | Huijsing et al. ............ 330/255 |
| 6,127,891 A | * | 10/2000 | Eschauzier et al. ......... 330/255 |
| 6,150,883 A | * | 11/2000 | Ivanov ........................ 330/253 |

OTHER PUBLICATIONS

"Some Design Aspects of a Two–Stage Rail–to–Rail CMOS Op Amp" by Sander L. J. Gierkink, Peter J. Holzmann, Remco J. Wiegerink and Roelof F. Wassenaar, Analog Integrated Circuits and Signal Processing, vol. 21, No. 2, Nov. 1999, pp 143–152.

"Compact Low–Voltage Power–Efficient Operational Amplifier Cells for VLSI" by Klaas–Jan de Langen and Johan H. Huijsing, IEEE Journal of Solid State Circuits, vol. 33, No. 10, Oct. 1998, pp. 1482–1496.

"Design Aspects of a Rail–to–Rail CMOS Op Amp" by Glierkink et al., Mesa Research institute, ECT–97–36, pp. 23–28.

* cited by examiner

Primary Examiner—Tuan T. Lam
(74) Attorney, Agent, or Firm—W. Daniel Swayze, Jr.; W. James Brady; Frederick J. Telecky, Jr.

(57) ABSTRACT

A class AB output stage includes an amplifying stage adapted to produce first (9) and second (10) output signals which incrementally increase and decrease in response to an incremental increase and decrease, respectively, of a first input signal ($I_{in1}$) and/or a second input signal ($I_{in2}$) A gate of a pull-up transistor (14) is coupled to receive the second signal (10), and a gate of a pull-down transistor (12) is coupled to receive the first signal (9). A first feedback circuit includes a first current sensing transistor (11) having a gate and source connected to the gate and source, respectively, of the pull-down transistor (12) and a drain coupled to a first control input (7) of the amplifying stage and operative to increase the gate voltage of the first current sensing transistor (11) only until its drain current increases to a first predetermined value representative of a minimum desired quiescent current in the pull-down transistor (12). A similar second feedback circuit operates to decrease the gate voltage of the second current sensing transistor (13) only until its drain current increases to a second predetermined value representative of a minimum desired quiescent current in the pull-up transistor.

15 Claims, 4 Drawing Sheets

FAST RAIL-TO-RAIL CLASS AB OUTPUT STAGE HAVING STABLE OUTPUT BIAS CURRENT AND LINEAR PERFORMANCE

BACKGROUND OF THE INVENTION

The invention relates to rail-to-rail class AB output stages, especially for rail-to-rail operational amplifiers, and more particularly to rail-to-rail class AB output stages which are both capable of operation with very low power supply voltages and also are sufficiently faster than operational amplifier front end circuitry to avoid non-linear distortion of the output signals.

The closest prior art includes U.S. Pat. No. 5,311,145 entitled "Combination Driver-Summing Circuit for Rail-to-Rail Differential Amplifier" issued May 10, 1994 to Huijsing et al. and incorporated herein by reference, U.S. Pat. No. 4,570,128 (Monticelli), the article "Compact Low-Voltage Power-Efficient Cells for VLSI", by K. Langen and J. Huijsing, IIIE Journal of Solid State Circuits, Volume 33, No. 10, pp. 1482–1496, the article "Rail-to-Rail Constant-Gm Input Stage and Class AB Output Stage for Low-Voltage CMOS Op Amps" by R. Wassenaar et al., Analog Integrated Circuits and Signal Processing, 1996, No. 6, pp. 121–123, and the article "Design Aspects of Rail-to-Rail CMOS OpAmp", by Gierkink, Holzmann, Wiegerink, and Wassenaar, proceedings of the 1st VLSI Workshop, May 6–8, 1997, Columbus, Ohio, pp. 23–28.

Figure 1:
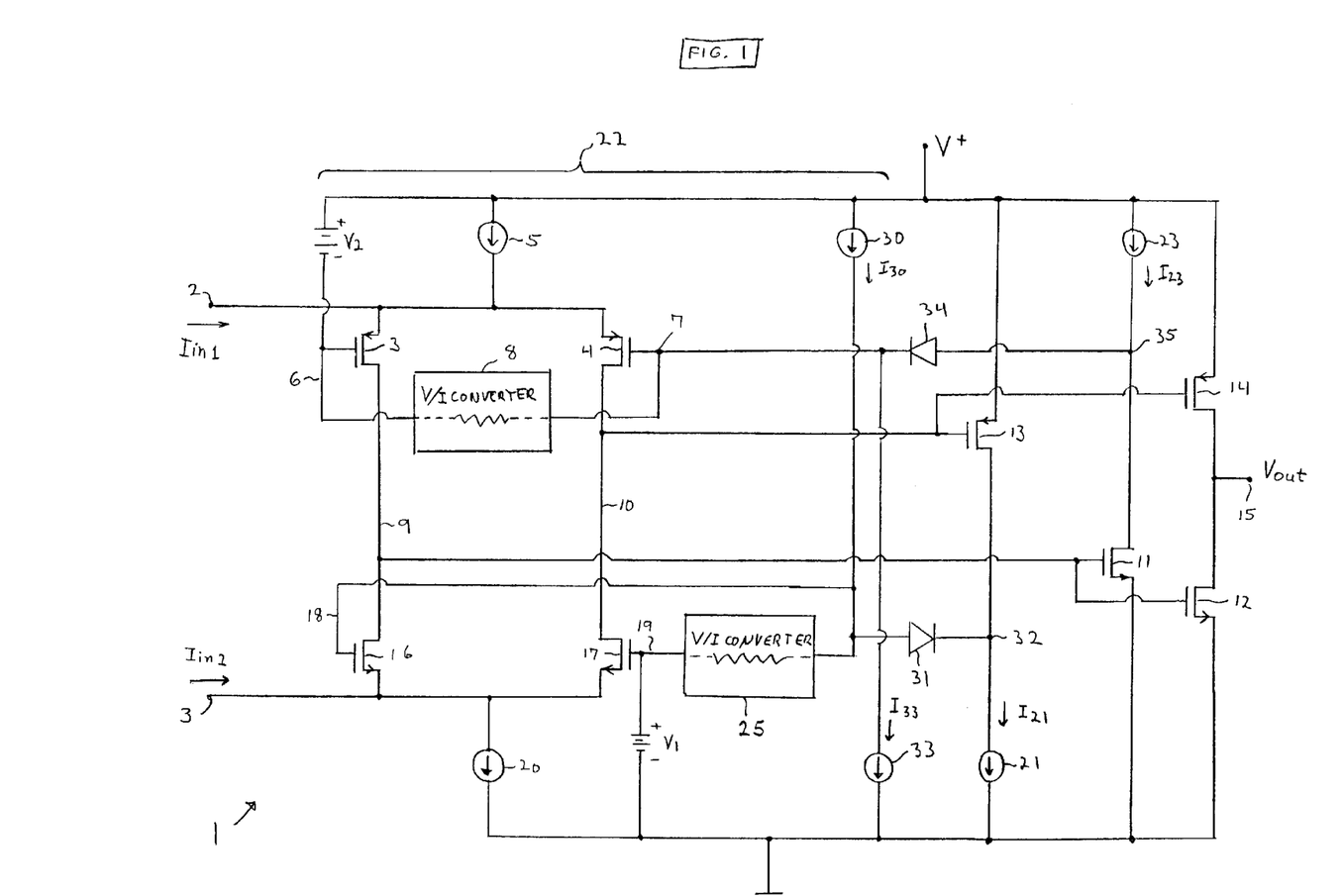
FIG. 1 is a schematic diagram of a rail-to-rail class AB output circuit of the invention.

Monticelli patent 4,570,128 discloses a rail-to-rail class AB output stage. FIG. 1 of prior art patent 5,311,145 discloses an operational amplifier capable of "rail-to-rail operation". The operational amplifier includes a differential amplifier input stage having two pairs of differentially coupled input MOSFETs, one with a tail current from the positive rail (i.e., supply voltage conductor) and the other with a tail current into the negative rail. A class A–B driver/output stage of the operational amplifier is coupled to a pair of folded cascode transistors to produce an output signal which is operative over nearly the full rail-to-rail supply voltage range. The article by Langen and Huijsing mainly discloses the circuitry in Patent 5,311,145 in more detail. The paper by Gierkink, Holzmann, Wiegerink, and Wassenaar discloses use of a gain boost amplifier with a cascode connection and a differential amplifier. The circuitry disclosed in this reference is very complex, and needs a large compensation capacitor. There is a need to provide a simpler circuit. The rail-to-rail class AB output stages disclosed in the foregoing articles all include multiple stage feedback circuits that produce three inversions and cause the feedback circuits to be substantially slower than the prior operational amplifier stages. The slowness causes both signal instability problems and non-linear signal distortion in the operational amplifier.

The circuit described in Huijsing et al. patent 5,311,145 is a two-stage circuit that does not have the capability of operating at a rail-to-rail supply voltage of less than approximately 2.2 volts. The gain of this circuit is too low for many applications. The speed-power figure of merit for the circuits described in patent 5,311,145 is much lower than desirable at lower rail-to-rail supply voltages. The circuit described in Monticelli patent 4,570,128 also has the shortcoming that a CMOS implementation thereof is not capable of rail-to-rail operation at power supply voltages less than approximately 2.2 volts.

SUMMARY OF THE INVENTION

Accordingly, it is an object of the invention to provide a class AB output stage suitable for use in an operational amplifier having at least two stages of front end circuitry, wherein the class AB output stage is fast enough to avoid non-linear distortion of the output signal produced by the operational amplifier.

It is another object of the invention to provide a rail-to-rail class AB output stage that is suitable for use in an operational amplifier having at least two stages of front end circuitry, wherein the class AB output stage is fast enough to avoid non-linear distortion of the output signal produced by the operational amplifier.

It is another object of the invention to provide a rail-to-rail class AB output stage that is suitable for use in an operational amplifier having at least two stages of front end circuitry, wherein the class AB output stage is fast enough to avoid non-linear distortion of the output signal produced by the operational amplifier and is also capable of operating at a power supply voltage as low as 1.8 volts.

It is another object of the invention to provide an improved amplifying stage for a rail-to-rail class AB output stage.

Briefly described, and in accordance with one embodiment thereof, the invention provides a class AB output stage including an amplifying stage, a pull-up transistor (14), a pull-down transistor (12), and first and second feedback circuits, the amplifying circuit it adapted to produce first (9) and second (10) output signals which incrementally increase and decrease in response to an incremental increase and decrease, respectively, of a first input signal ($I_{in1}$), and which also incrementally increase and decrease in response to an incremental increase and decrease, respectively, of a second input signal ($I_{in2}$). The pull-up transistor (14) has a source coupled to a first supply voltage conductor ($V^+$), a gate coupled to receive the second signal (10), and a drain coupled to an output terminal (15). The pull-down transistor (12) has a source coupled to a second supply voltage conductor (GND), a gate coupled to receive the first signal (9), and a drain coupled to the output terminal (15). The first feedback circuit includes a first current sensing transistor (11) having a gate and source connected to the gate and source, respectively, of the pull-down transistor (12) and a drain coupled to a first control input (7) of the amplifying stage and operative to increase the gate voltage of the first current sensing transistor (11) only until its drain current increases to a first predetermined value representative of a minimum desired quiescent current in the pull-down transistor (12). The second feedback circuit includes a second current sensing transistor (13) having a gate and source connected to the gate and source, respectively, of the pull-up transistor (14), and a drain coupled to a second control input (18) of the amplifying stage and operative to decrease the gate voltage of the second current sensing transistor (13) only until its drain current increases to a second predetermined value representative of a minimum desired quiescent current in the pull-up transistor.

The first feedback circuit includes a first limiting circuit (34 or 45,44,41) adapted to prevent feedback from the drain of the first current sensing transistor (11) to the first control terminal (7) if the drain current of the first current sensing transistor (11) exceeds the first predetermined value, and wherein the second feedback circuit includes a second limiting circuit (31 or 43,42,40) adapted to prevent feedback from the drain of the second current sensing transistor (13) to the second control terminal (18) if the drain currents of the second current sensing transistor (13) exceeds the second predetermined value.

In the described embodiments, the amplifying stage (22) includes first (3), second (4), third (16), and fourth (17)

transistors, first (5) and second (20) constant current sources, and first (8) and second (25) V/I converters, the sources of the first and second transistors being connected to the first signal input conductor (2) and the first constant current source (5). The sources of the third and fourth transistors are connected to the second signal input conductor (3) and the second constant current source in (20), the drain of the third transistor (16) is connected by the first output conductor (9) to the drain of the first transistor (3), and the drain of the fourth transistor (17) is connected by the second output conductor (10) to the drain of the second transistor (4). The gates of the first, second, third, and fourth transistors are connected to the first reference voltage (6), the first control conductor (7), the second control conductor (18), and the second the reference voltage (19), respectively. The first V/I converter (8) is connected between the gates of the first (3) and second (4) transistors. The second V/I converter (25) is connected between the gates of the third (16) and fourth (17) transistors. The pull-up transistor (14), first transistor (3), and second transistor (4) are P-channel MOSFETs, and the pull-down transistor (12), third transistor (16) and fourth transistor (17) are N-channel MOSFETs. The first V/I converter (8) includes a differential stage including first (8A) and second (8B) P-channel input MOSFETs, a third constant current source (8C), and first (8D) and second (8E) N-channel load MOSFETs. The sources of the first (8A) and second (8B) P-channel input MOSFETs are connected to the first constant current source (8C), and the drain of the first P-channel input MOSFET (8A) is connected to the drain and gate of the first N-channel load MOSFET (8B) and the gate of the second N-channel load MOSFET (8E). The drain of the second (8B) P-channel input MOSFET is connected to the drain of the second N-channel load MOSFET (8E), the gate of the second P-channel input MOSFET (8B) and the first control conductor (7). The sources of the first (8D) and second (8E) N-channel load MOSFETs are connected to the second supply voltage conductor (GND), and the gate of the first P-channel input MOSFET (8A) is connected to the first reference voltage conductor (6). The second V/I converter (25) includes a differential stage including third (25A) and fourth (25B) N-channel input MOSFETs, a fourth constant current source (25C), and third (25D) and fourth (25E) P-channel load MOSFETs. The sources of the third (25A) and fourth (25B) N-channel input MOSFETs are connected to the fourth constant current source (25C), and the drain of the third N-channel input MOSFET (25A) is connected to the drain of the third P-channel load MOSFET (25D) and the gates of the third (25D) and fourth (25E) P-channel load devices. The sources of the third (25D) and fourth (25E) P-channel load MOSFETs are connected to the first supply voltage conductor (V), and the drain of the fourth P-channel load MOSFET (25E) is connected to the gate of the fourth N-channel input MOSFET (25B) and to the second control conductor (18), the gate of the third N-channel input MOSFET (25A) being connected to the first reference voltage conductor (19). The first feedback circuit includes a first reference current source (23) coupled to the drain (35) of the first current sensing transistor (11) and supplying a current equal to the first predetermined value, a first rectifying circuit (34 or 36) coupled between the drain (35) of the first current sensing transistor (11) and the first control conductor (7). The second feedback circuit includes a second reference current source (21) coupled to the drain (32) of the second current sensing transistor (13) and supplying a current equal to the second predetermined value, a second rectifying circuit (31 or 37) coupled between the drain of the second current sensing transistor (13) and the second control conductor (18). The first rectifying circuit includes a P-channel MOSFET (36) having a gate connected to the first reference conductor (6), a source connected to the drain (35) of the first current sensing transistor (11), and a drain connected to the first control conductor (7). The second rectifying circuit includes a P-channel MOSFET (37) having a gate connected to the second reference conductor (19), a source connected to the drain of the second current sensing transistor (13), and a drain connected to the second control conductor (18).

DETAILED DESCRIPTION OF THE PREFERRED EMBODIMENTS

Figure 1A:
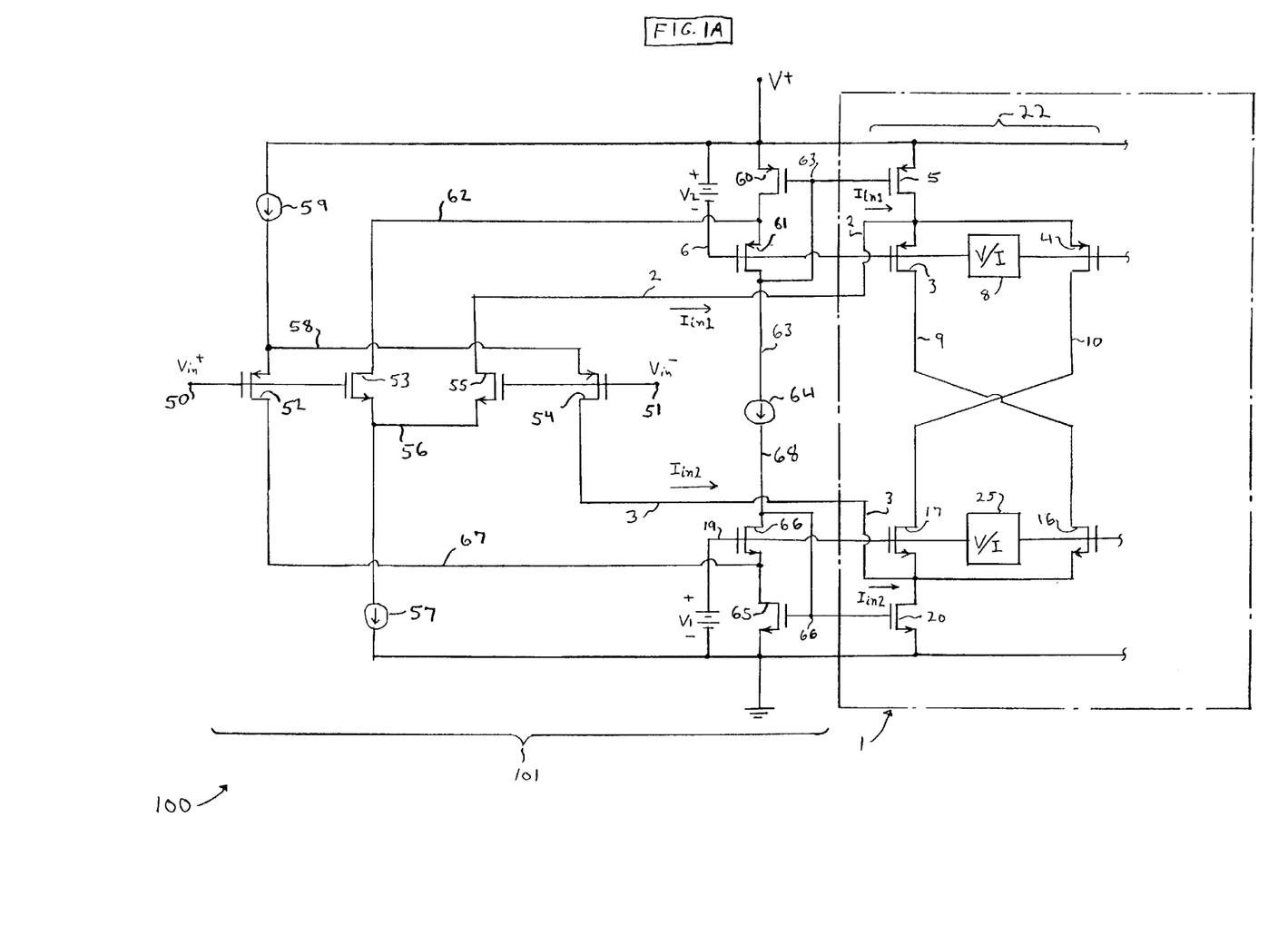
FIG. 1A is a schematic diagram which shows details of the front end portion of a rail-to-rail operational amplifier which includes the rail-to-rail class AB output stage of FIG. 1.

Referring to FIG. 1, rail-to-rail class AB output stage 1 includes an amplifying stage 22 that receives an input current $I_{in1}$ and an input current $I_{in2}$ from a previous stage of a rail-to-rail operational amplifier. Amplifying stage 22 includes signal input terminals 2 and 3, differential circuits 3,4,5 and 16,17,20, V/I converters 8 and 25, output terminals 9 and 10, control terminals 7 and 18, and reference terminals 6 and 19. Subsequently described constant current sources 30 and 33, if needed, also can be included in amplifying stage 22. Subsequently described FIG. 1A shows details of the front end circuitry of such an operational amplifier. Typically, the prior stage of the operational amplifier includes an upper folded cascode transistor which supplies the current $I_{in1}$ into signal input conductor 2, and a lower folded cascode transistor which supplies the lower input current $I_{in2}$ into signal input conductor 3.

Input conductor 2 is connected to a common source electrode of a pair of differentially connected P-channel input MOSFETs 3 and 4. The sources of MOSFETs 3 and 4 also are coupled by a constant current source 5 to the positive supply voltage $V^+$. The drain electrode of MOSFET 3 is coupled by a conductor 9 to the drain of an N-channel input MOSFET 16. Conductor 9 is a first output of amplifying stage 22. The drain of MOSFET 4 is connected by conductor 10 to the drain of an N-channel input MOSFET 17. Conductor 10 is a second output of amplifying stage 22. The source electrodes of MOSFETs 16 and 17 are connected to input conductor 3, which is coupled by constant current source 20 to ground.

A voltage-to-current (V/I) converter 8 has one terminal connected by conductor 6 to the gate of MOSFET 3, which is maintained at a bias voltage that is $V_2$ volts below $V^+$. The other terminal of V/I converter 8 is connected by a conductor 7 to the gate of MOSFET 4 and to the cathode of a diode 34. Conductor 7 is a first control terminal of amplifying stage 22. The anode of diode 34 is connected to conductor 35. Similarly, a V/I converter 25 has one terminal connected by conductor 19 to the gate of MOSFET 17. Conductor 19 is maintained at a bias voltage level of $V_1$ volts above ground. The other terminal of V/I converter 25 is connected by conductor 18 to the gate of MOSFET 16 and to the anode of a diode 31, the cathode of which is connected to conductor 32. Conductor 18 is a second control terminal of amplifying stage 22. Each of V/I converters 8 and 25 can be implemented by means of a resistor as indicated in dotted lines, or preferably by means of a differential stage as shown in subsequently described FIGS. 2 and 3.

Output conductor 9 of amplifying stage 22 is connected to the gate of an N-channel pull-down MOSFET 12 having its source connected to ground and its drain connected by output conductor 15 to the drain of a P-channel pull-up MOSFET 14 having its source connected to V+. Output conductor 9 also is connected to the gate of an N-channel current sensor MOSFET 11 having its source connected to ground, so the drain current of sensor MOSFET 11 is a scaled representation of the current in pull-down MOSFET 12. The drain of current sensor MOSFET 11 is connected by conductor 35 to one terminal of a reference current source 23 providing a constant reference current $I_{23}$. The other terminal of reference current source 23 is connected to V+.

Similarly, output conductor 10 is connected to the gate of P-channel pull-up MOSFET 14 and also to the gate of a P-channel current sensor MOSFET 13 having its source connected to V+. The drain current of sensor MOSFET 13 is a scaled representation of the current in the drain of pull-up MOSFET 14. The drain of current sensor MOSFET 13 is connected by conductor 32 to one terminal of a reference current source 21 having its other terminal connected to ground. A constant reference current $I_{21}$ is supplied by current source 21.

The drains of output MOSFETs 12 and 14 are connected to output conductor 15 and produce thereon an output voltage $V_{out}$ which is proportional to either of the currents $I_{in1}$ and $I_{in2}$ or the sum of $I_{in1}$ and $I_{in2}$.

Figure 2:
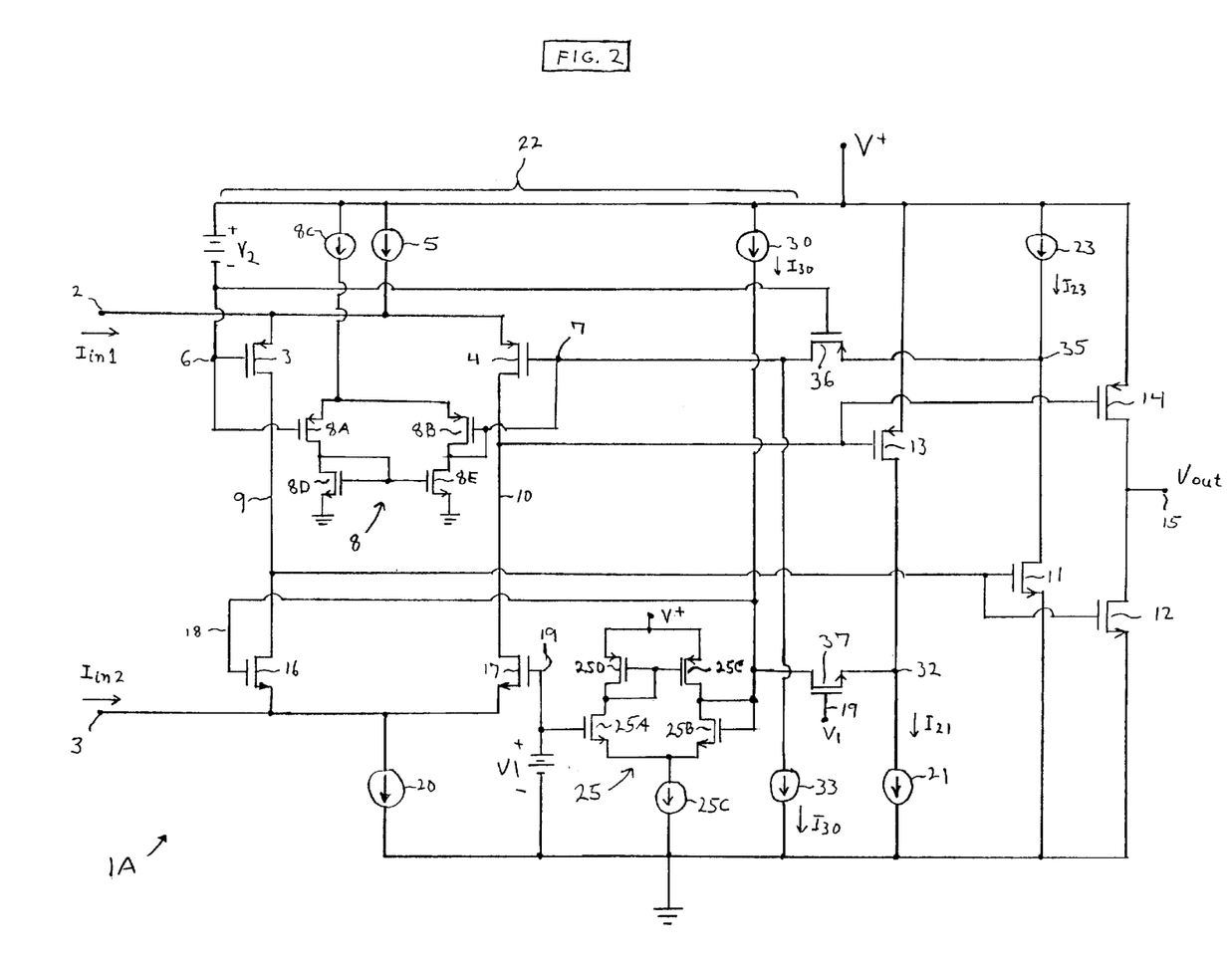
FIG. 2 is a schematic diagram of a presently preferred implementation of the circuit shown in FIG. 1.
Figure 3:
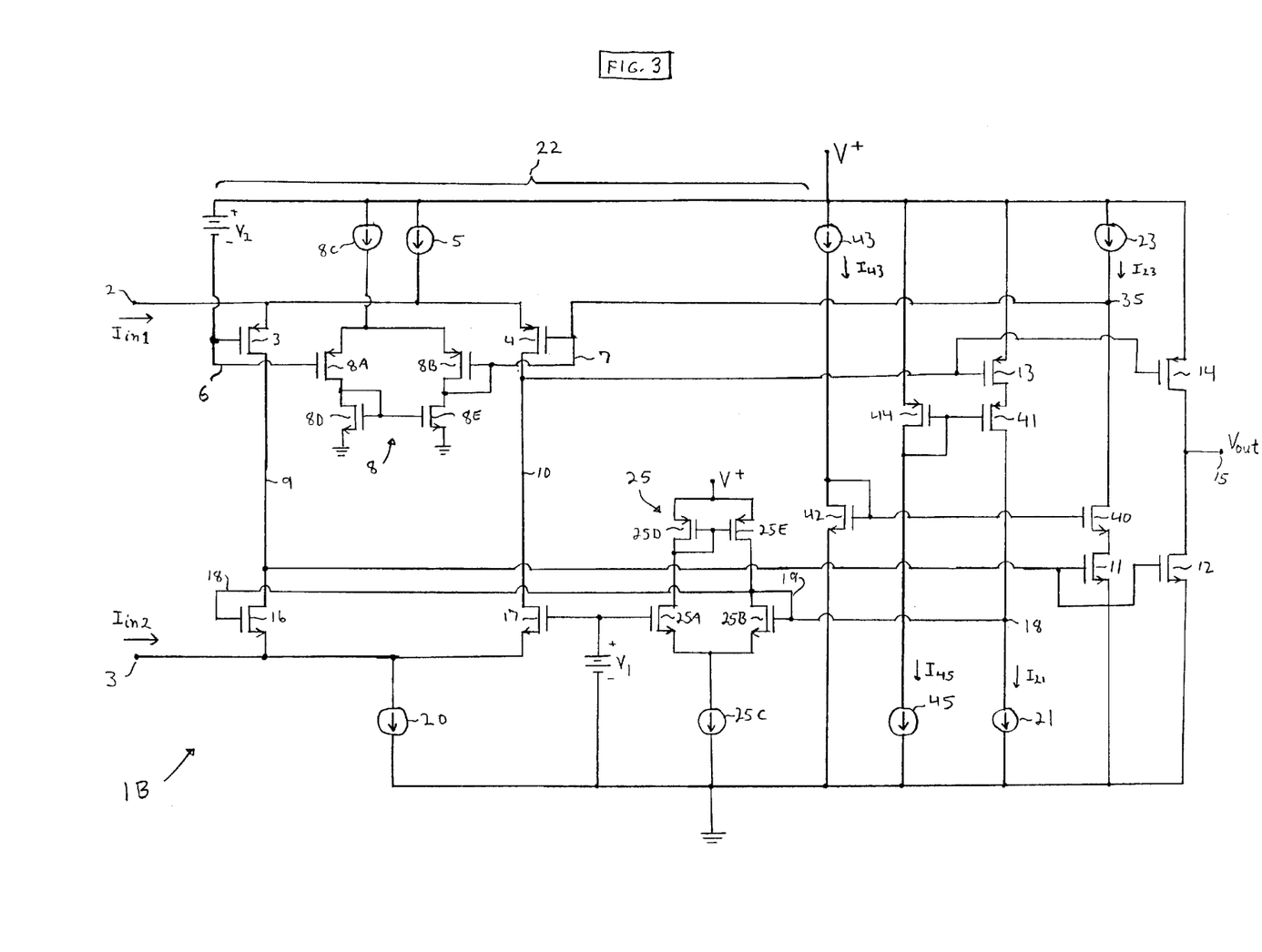
FIG. 3 is a schematic diagram of a another implementation of the embodiment shown in FIG. 1.

At this point it may be helpful to describe FIG. 1A, which is a schematic diagram of an operational amplifier 100 that includes as its output stage the rail-to-rail class AB output stage of FIGS. 1, 2 or 3. For convenience, only a portion of the circuitry of the class AB output stage 1 is shown in FIG. 1A, within the dashed lines.

Operational amplifier 100 includes front end circuitry 101 that includes a first differential input stage 52,54,59, a second differential input stage 53,55,57, and a pair of folded cascode circuits which supply the input currents $I_{in1}$ and $I_{in2}$ into input conductors 2 and 3 of class AB output stage 1 in response to a differential input voltage signal $V_{in}=V_{in}^+ - V_{in}^-$. The input voltage $V_{in}^+$ is applied by input conductor 50 to the gates of a PNP input MOSFET 52 and an NPN input MOSFET 53. $V_{in}^-$ is applied by conductor 51 to the gates of a P-channel input MOSFET 54 and an N-channel input MOSFET 55.

The sources of N-channel input MOSFETs 53 and 55 are connected by conductor 56 to one terminal of constant current source 57, the other terminal of which is connected to ground. The drain of N-channel input MOSFET 55 is connected to conductor 2, to supply $I_{in1}$ into the junction of the sources of PNP MOSFETs 3 and 4 and the drain of a P-channel MOSFET 5. MOSFET 5 constitutes constant current source 5 of class AB output stage 1. The drain of N-channel input MOSFET 53 is connected by conductor 62 to the drain of a P-channel MOSFET 60 and the source of a P-channel folded cascode MOSFET 61. The source of MOSFET 60 is connected to V+, and its gate is connected by conductor 63 to the gate of current source MOSFET 5 of class AB output stage 1. The gate of folded cascode MOSFET 61 is connected by conductor 6 to the negative terminal of constant voltage source V2, also shown in FIG. 1. The drain of folded cascode MOSFET 61 is connected by conductor 63 to one terminal of a constant current source 64 and to the gates of MOSFETs 5 and 60.

The sources of P-channel input MOSFETs 52 and 54 of front end circuit 101 are connected by conductor 58 to one terminal of a constant current source 59, the other terminal of which is connected to V+. The drain of input MOSFET 54 is connected by input conductor 3 to the junction of the sources of N-channel MOSFETs 16 and 17 of class AB output stage 1 and the drain of the N-channel MOSFET 20, which constitutes constant current source 20 of FIG. 1. The drain of input MOSFET 54 supplies the input current $I_{in2}$ into conductor 3. The drain of input MOSFET 52 is connected by conductor 67 to the drain of N-channel MOSFET 65, the source of which is connected to ground. Conductor 67 also is connected to the source of an N-channel folded cascode MOSFET 66, the drain of which is connected by conductor 68 to a second terminal of constant current source 64 and to the gates of MOSFET 65 and current source MOSFET 20.

Note that the general operation of the differential front end portion 101 of operational amplifier 100 is well known; see, for example, above mentioned Huijsing et al. patent 5,311, 145.

Referring again to FIG. 1, it should be noted that the DC voltages on output conductors 9 and 10 of amplifying stage 22 are unequal. This is because the feedback from the drain of current sensor MOSFET 13 to its gate through conductor 32, diode 31, and V/I converter 25 operates to maintain conductor 10 at a first DC level. The DC voltage on conductor 9 is maintained at a second DC level which is determined by feedback from the drain of current sensor MOSFET 11 through conductor 35, diode 34, V/I converter 8 and conductor 9 to the gate of MOSFET 11, and the second DC level on conductor 10 is much different than the first DC level on conductor 9. However, those skilled in the art will recognize that the effect of an incremental or AC increase in the value of the differential input voltage signal $V_{in}=V_{in}^+ - V_{in}^-$ may be to produce equal incremental increases in both $I_{in1}$ and $I_{in2}$, or to produce an incremental increase in only one of $I_{in1}$ and $I_{in2}$, depending on the value of their common mode voltage.

The operation of rail-to-rail class AB output circuit 1 of FIG. 1 in response to an incremental increase in $I_{in1}$ will be described next. Note that the following description assumes "ideal" operation of MOSFETs 3 and 4, that MOSFETs 3 and 4 have equal channel geometries, and also that initially there is no current through V/I converter 8. In that case, both conductors 6 and 7 initially are at $V^+ - V_2$ volts. The current through current source 5 is constant, so the incremental increase in $I_{in1}$ results in an incremental increase in the voltage on conductor 2. This increases the amplitudes of the gate-to-source voltages that turn on P-channel MOSFETs 3 and 4, equally increasing their drain currents (assuming that MOSFET's 3 and 4 have equal channel geometries and ideal transistor properties). That results in equal incremental increases in the voltages on conductors 9 and 10.

The above mentioned incremental increase in the voltage on output conductor 9 of amplifying stage 22 increases the gate-to-source voltages of N-channel pull-down MOSFET 12 and its N-channel current sensor MOSFET 11. This proportionately increases their respective drain currents.

However, the corresponding equal incremental increase in voltage on output conductor 10 of amplifying stage 22 decreases the amplitudes of the gate-to-source voltages of P-channel pull-up MOSFET 14 and its corresponding P-channel current sensor MOSFET 13, proportionately decreasing the drain currents of P-channel pull-up MOSFET 14 and P-channel current sensor MOSFET 13.

The increasing drain current of pull-down MOSFET 12 and corresponding decreasing drain current of pull-up MOSFET 14 results in a proportional incremental reduction in $V_{out}$ in response to the incremental increase in $I_{in1}$.

The function of current sensor transistor 11, diode 34, constant reference current source 23, and V/I converter 8 is to provide feedback to differentially connected MOSFETs 3 and 4 so as to stabilize the quiescent pull-down current through pull-down transistor 12 at a value no less than a predetermined minimum quiescent level. Similarly, the function of P-channel current sensing MOSFET 13, diode 31, V/I converter 25, and constant reference current source 21 is to stabilize the quiescent pull-up current through P-channel pull-up MOSFET 14 at no less than the predetermined minimum quiescent level.

For example, if the pull-down current through MOSFET 12 is lower than the predetermined minimum quiescent level, then the corresponding drain current through current sensor MOSFET 11 is less than the constant reference current $I_{23}$ of current source 23. This causes diode 34 to be forward biased by the excess of $I_{23}$ over the drain current of sensor MOSFET 11, so the excess current flows through control terminal 7 of amplifying stage 22 and through V/I converter 8. The resulting voltage drop across V/I converter 8 causes the voltage on control conductor 7 to be higher than the voltage on reference conductor 6, producing an imbalance that causes MOSFET 3 to be turned on harder than MOSFET 4. Therefore, more of the current from constant current source 5 flows through MOSFET 3, causing an increase of the voltage on output conductor 9 and a decrease in the voltage on output conductor 10 of amplifying stage 22. The voltage increase on conductor 9 tends to further turn on current sensor MOSFET 11 and pull-down MOSFET 12, until the drain current of current sensor MOSFET 11 equals the reference current $I_{23}$, which occurs when differentially coupled MOSFETs 3 and 4 become balanced as a result of the current through V/I converter 8 being reduced to zero.

Similarly, if the pull-up current through MOSFET 14 is less than the predetermined minimum quiescent value, the drain current of current sensor MOSFET 13 is less than reference current $I_{21}$. Then diode 31 is forward biased and the excess of $I_{21}$ over the drain current of sensor MOSFET 13 flows through diode 31, control terminal 18, and V/I converter 25. This creates an imbalance between differentially connected N-channel MOSFETs 16 and 17, producing feedback through output conductors 9 and 10 of amplifying stage 22 to the gates of current sensor MOSFET 13 and pull-up MOSFET 14. This feedback increases the drain current of sensor MOSFET 13 until the gate-to-source voltages of transistors 16 and 17 are balanced. That occurs when the drain current of current sensor MOSFET 13 becomes equal to reference current $I_{21}$ and the quiescent pull-down current through MOSFET 14 has its desired value.

For higher values of pull-up current through pull-up MOSFET 14 or higher values of pull-down current through pull-down MOSFET 12 resulting from a large differential input current $I_{in1}$-$I_{in2}$, diodes 31 and 34 are reverse biased and provide no feedback.

As indicated earlier, the foregoing discussion assumes that the various MOSFETs have "ideal" characteristics in the sense that their drain currents are equal if their gates are at the same voltage and their sources are at the same voltage. Actually, however, MOSFETs 16 and 17 have substantially different drain currents when their gates are at the same voltage and their drains are at the same voltage. Constant current source 30 produces a bias current through control terminal 18 and V/I converter 25 so that the gate voltage of MOSFET 16 is sufficiently lower than the gate voltage of MOSFET 17 so as to partially or entirely equalize the drain currents of MOSFETs 16 and 17 even though their drains are at substantially different voltages. The W/L ratios (i.e., channel width to channel length ratios) of MOSFETs 16 and 17 can be selected to further equalize their drain currents. Similarly, constant current source 33 can be provided to develop a voltage across V/I converter 8 so as to equalize the drain currents of MOSFETs 3 and 4 even though their drain voltages are unequal. Constant current sources 30 and 33 can be omitted if MOSFETs 3, 4, 16 and 17 have sufficiently ideal characteristics that they do not need to be compensated for variation in their drain currents resulting from differences in their respective drain to source voltages.

The operation of class AB output stage 1 in response to an incremental decrease in $I_{in1}$ is analogous to that described above for an incremental increase in $I_{in1}$. The voltages on output conductors 9 and 10 decrease in response to the incremental decrease in $I_{in1}$. The operation of the feedback circuitry unbalances the gate-to-source voltages of the differential pair of MOSFETs 3,4 and/or the pair of differential MOSFETs 16,17, if necessary, so as to increase the quiescent currents in current sensor MOSFETs 11 and/or 13 to equal the values of reference currents $I_{23}$ and $I_{21}$, respectively.

The operation of class AB output stage 1 in response to positive or negative incremental changes in $I_{in2}$ is very similar to the above described response to incremental changes in $I_{in1}$, and therefore will not be further explained.

Thus, in FIG. 1, the output voltage $V_{out}$ is determined by the difference between the input currents $I_{in1}$ and $I_{in2}$. The quiescent currents through pull-up MOSFET 14 and pull-down MOSFET 12 are maintained by the feedback voltages developed across the V/I converters 8 and 25, respectively, which in turn sufficiently unbalance (or sufficiently further unbalance) the gate voltages of the differentially coupled P-channel input MOSFETs 3 and 4 and the differentially coupled input MOSFETs 16 and 17 to ensure that the quiescent currents in output MOSFETs 12 and 14 are never less than the desired maximum value. The voltages across V/I converters 8 and 25 are determined by any amounts by which the reference currents $I_{21}$ and $I_{23}$ exceed the drain currents of current sensor MOSFETs 13 and 11, respectively. However, if the drain currents of either or both of current sensor MOSFETs 11 and 13 are greater than the reference currents $I_{21}$ and $I_{23}$, respectively, then diodes 31 and 34 are reverse biased so no further feedback is provided to control terminal 7 or 18, as such further feedback would disrupt proper operation of class AB stage 1 by undesirably increasing the quiescent currents in output MOSFETs 12 and 14.

An important advantage of class AB output stage 1 is that the feedback loops from the drains of current sensor MOSFETs 11 and 13 through diodes 34 and 31, respectively, are much faster than the preceding amplifier stage 101 of FIG. 1A. The structure and speed of the feedback loops and the resulting fast class AB operation avoid the unstable quiescent pull-up current and unstable quiescent pull-down current of the prior art rail-to-rail class AB output stages, and also avoid the non-linear distortion of the class AB output stages of the prior art rail-to-rail operational amplifiers.

The above described rail-to-rail class AB output stages of FIG. 1, and also subsequently described FIGS. 2 and 3, are capable of operating at a minimum voltage equal to the sum of the minimum source-to-drain voltage ($V_{sat}$) of the P-channel MOSFET 5 (FIG. 1A) constituting constant current source 5, the minimum source-to-drain voltage ($V_{sat}$) of the P-channel input transistor 3, and the threshold voltage of N-channel pull-down MOSFET 12. If the two minimum $V_{sat}$ voltages each are 0.1 volts and the threshold voltage (referred to as $V_T$) is 0.9 volts, then class AB output stage 1 is operable for a supply voltage $V^+$ as low as approximately $2V_{sat}+V_T=1.1$ volts.

The circuit of FIG. 2 shows a rail-to-rail class AB output circuit 1A which is one implementation of the circuit of FIG. 1, in which V/I converter 8 includes a differential stage 8 having differentially coupled PNP MOSFETs 8A and 8B with their sources coupled by constant current source 8C to $V^+$ and their drains coupled to a current mirror load circuit including N-channel MOSFETs 8D and 8E, as shown. The gate of MOSFET 8A is connected to the gate of MOSFET 3, and the gate of MOSFET 8B is connected by conductor 7 to the gate of MOSFET 4 and the drain of MOSFET 8B. Similarly, V/I converter 25 includes a differential circuit 25 having differentially coupled N-channel MOSFETs 25A and 25B the sources of which are coupled by constant current source 25C to ground. The drains of MOSFETs 25A and 25B are coupled to the drains of a pair of P-channel load MOSFETs 25D and 25D coupled as a current mirror load circuit. The gate of MOSFET 25A is connected to the gate of MOSFET 17, and the gate of MOSFET 25B is connected by conductor 18 to the gate of MOSFET 16 and the drain of MOSFET 25B.

The differential amplifier implementation of V/I converter 8 in FIG. 2 has the same operative effect as the resistor 8 shown in FIG. 1. For example, if the voltage on control conductor 7 is equal to the voltage on conductor 6, then the constant current from current source 8C is equally split to flow through MOSFETs 8A and 8B. Load MOSFETs 8D and 8E form a current mirror, so the current flowing through MOSFET 8A and MOSFET 8D causes an equal current to be mirrored through MOSFET 8E. Since the current through MOSFET 8E is equal to the current through MOSFET 8B, no current flows through control conductor 7, which is coupled by diode-connected P-channel MOSFET 36 to the junction 35 between current source 23 and the drain of MOSFET 40.

Then, if the voltage of control conductor 7 and conductor 35 is increased slightly, the gate-to-source voltage of MOSFET 8B is reduced, more of the current from current source 8C flows through MOSFETs 8A and 8D, which mirrors a larger current through MOSFET 8E, while a reduced amount of current flows through MOSFET 8B. This causes a current equal to the difference between the currents in MOSFETs 8E and 8B to flow from junction 35 and MOSFET 36 through conductor 7 and MOSFET 8E to ground. Therefore, the effect of the differential stage 8 in FIG. 3 is essentially the same as the operation of the resistor 8 shown in FIG. 2.

In FIG. 2, the rectifier circuit represented by diode 34 in FIG. 1 is replaced by P-channel MOSFET 36, which has its source connected to conductor 35, its drain connected to control conductor 7, and its gate connected to conductor 6. Similarly, the rectifier circuit represented by diode 31 in FIG. 1 is replaced in FIG. 2 by an N-channel MOSFET having its source connected to conductor 32, its drain connected to control conductor 18, and its gate connected to conductor 19.

The operation of class AB output stage 1A of FIG. 2 is very similar to the operation described above for class AB output stage 1 of FIG. 1.

In FIG. 2, if the drain current of current sensor MOSFET 11 is less than reference current $I_{23}$, the voltage on conductor 35 rises to a sufficiently high level to exceed the voltage on the gate of MOSFET 36 by its threshold voltage. Then, an amount of current equal to the excess of $I_{23}$ over the drain current of MOSFET 11 flows through MOSFET 36. The operation of N-channel MOSFET 37 in conjunction with the drain current of current sensor 13, current source 21, and current source 30 is similar.

FIG. 3 shows another implementation of the embodiment of FIG. 1, wherein rail-to-rail class AB output circuit 1B includes the same differential input circuit including MOSFETs 3, 4, 16 and 17 and the same constant current sources 5 and 20 as shown in FIG. 1. Rail-to-rail class AB output stage 1B of FIG. 3 also includes the same pull-up MOSFET 14 and pull-down MOSFET 12 and the same constant current sources 21 and 22 shown in FIG. 1. V/I converters 8 and 25 of FIG. 3 are the same as in FIG. 2.

A first current limit circuit includes a P-channel MOSFET 41 having its source connected to the drain of MOSFET 13, its drain coupled to the upper terminal of constant current source 21, and its gate coupled to the gate and drain of a P-channel MOSFET 44. The source of MOSFET 44 is connected to $V^+$, and the drain and gate of MOSFET 44 are connected to the upper terminal of a constant current source 45. Similarly, a second current limit circuit includes an N-channel MOSFET 40 having its source connected to the drain of MOSFET 11. The drain of MOSFET 40 is connected by conductor 35 to the lower terminal of current source 23. The gate of MOSFET 40 is connected to both the gate and drain of an N-channel MOSFET 42 having its source connected to ground.

The basic operation of the embodiment shown in FIG. 3 is generally similar to the operation described above for the embodiments of FIGS. 1 and 2, except that diodes 31 and 34 are omitted. Instead, constant current source 43 and diode-connected MOSFET 42 and MOSFET 40 function as a current mirror that prevents the current through MOSFET 40 from exceeding $I_{43}$. Therefore, the current through current sensor MOSFET 11 can not exceed $I_{43}$ either, regardless of how high the voltage goes on conductor 9. Similarly, constant current source 45, MOSFET 44, and MOSFET 41 function as a current mirror that prevents the current through current sensor MOSFET 13 from ever exceeding $I_{45}$, regardless of how low the voltage on conductor 10 goes.

The above described limiting of the currents through current sensor MOSFETs 11 and 13 prevents feedback from their respective drains to the V/I converters 8 and 25. This prevents excessive feedback from producing excessively large quiescent currents in output MOSFETs 12 and 14.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the MOSFETs in the described embodiment can be replaced by corresponding bipolar PNP and NPN transistors, respectively, in which case circuit operation will be basically the same.

What is claimed is:

1. A class AB output stage, comprising:
   (a) an amplifying stage adapted to produce first and second output signals which incrementally increase and decrease in response to an incremental increase and decrease, respectively, of a first input signal, and which also incrementally increase and decrease in response to an incremental increase and decrease, respectively, of a second input signal;

(b) a pull-up transistor having a first electrode coupled to a first supply voltage conductor, a control electrode coupled to receive the second output signal, and a second electrode coupled to an output terminal, and a pull-down transistor having a first electrode coupled to a second supply voltage conductor, a control electrode coupled to receive the first output signal, and a second electrode coupled to the output terminal;

(c) a first feedback circuit including a first current sensing transistor having a control electrode and first electrode connected to the control electrode and first electrode, respectively, of the pull-down transistor and a second electrode coupled to a first control input of the amplifying stage and operative to increase the control electrode voltage of the first current sensing transistor only until its second electrode current increases to a first predetermined value representative of a minimum desired quiescent current in the pull-down transistor, and a second feedback circuit including a second current sensing transistor having a control electrode and first electrode connected to the control electrode and first electrode, respectively, of the pull-up transistor, and a second electrode coupled to a second control input of the amplifying stage and operative to decrease the control electrode voltage of the second current sensing transistor only until its second electrode current increases to a second predetermined value representative of a minimum desired quiescent current in the pull-up transistor.

2. The class AB stage of claim 1 wherein the pull-down transistor and the first current sensing transistor are N-channel MOSFETs, and the pull-up transistor and the second current sensing transistor are P-channel MOSFETs.

3. The class AB output stage of claim 1 wherein the first feedback circuit includes a first limiting circuit adapted to prevent feedback from the second electrode of the first current sensing transistor to the first control terminal if the second electrode current of the first current sensing transistor exceeds the first predetermined value, and wherein the second feedback circuit includes a second limiting circuit adapted to prevent feedback from the second electrode of the second current sensing transistor to the second control terminal if the second electrode current of the second current sensing transistor exceeds the second predetermined value.

4. A class AB output stage, comprising:

(a) an amplifying stage adapted to produce first and second output signals which incrementally increase and decrease in response to an incremental increase and decrease, respectively, of a first input signal, and which also incrementally increase and decrease in response to an incremental increase and decrease, respectively, of a second input signal, the amplifying stage including first and second signal input conductors on which the first and second input signals are applied, respectively, first and second output conductors on which the first and second output signals are applied, respectively, first and second control conductors, and first and second reference conductors;

(b) a pull-up transistor having a source coupled to a first supply voltage conductor, a gate coupled to receive the second output signal, and a drain coupled to an output terminal, and a pull-down transistor having a source coupled to a second supply voltage conductor, a gate coupled to receive the first output signal, and a drain coupled to the output terminal;

(c) a first feedback circuit including a first current sensing transistor having a gate and source connected to the gate and source, respectively, of the pull-down transistor and a drain coupled to the first control conductor and operative to increase the second output signal only until the drain current of the first current sensing transistor increases to a first predetermined value representative of a minimum desired quiescent current in the pull-down transistor, and a second feedback circuit including a second current sensing transistor having a gate and source connected to the gate and source, respectively, of the pull-up transistor, and a drain coupled to the second control conductor and operative to decrease the first output signal only until the drain current of the second current sensing transistor increases to a second predetermined value representative of a minimum desired quiescent current in the pull-up transistor.

5. The class AB amplifier stage of claim 4 wherein the amplifying stage includes first, second, third, and fourth transistors, first and second constant current sources, and first and second V/I converters, the sources of the first and second transistors being connected to the first signal input conductor and the first constant current source, the sources of the third and fourth transistors being connected to the second signal input conductor and the second constant current source, the drain of the third transistor being connected by the first output conductor to the drain of the first transistor, the drain of the fourth transistor being connected by the second output conductor to the drain of the second transistor, the gates of the first, second, third, and fourth transistors being connected to the first reference voltage, the first control conductor, the second control conductor, and the second the reference voltage, respectively, the first V/I converter being connected between the gates of the first and second transistors, the second V/I converter being connected between the gates of the third and fourth transistors.

6. The class AB output stage of claim 5 wherein the pull-up transistor, first transistor, and second transistor are P-channel MOSFETs, and the pull-down transistor, third transistor and fourth transistor are N-channel MOSFETs.

7. The class AB output stage of claim 6 wherein the first V/I converter includes a differential stage including first and second P-channel input MOSFETs, a third constant current source, and first and second N-channel load MOSFETs, the sources of the first and second P-channel input MOSFETs being connected to the third constant current source, the drain of the first P-channel input MOSFET being connected to the drain and gate of the first N-channel load MOSFET and the gate of the second N-channel load MOSFET, the drain of the second P-channel input MOSFET being connected to the drain of the second N-channel load MOSFET, the gate of the second P-channel input MOSFET and the first control conductor, the sources of the first and second N-channel load MOSFETs being connected to the second supply voltage conductor, the gate of the first P-channel input MOSFET being connected to the first reference voltage conductor, wherein the second V/I converter includes a differential stage including third and fourth N-channel input MOSFETs, a fourth constant current source, and third and fourth P-channel load MOSFETs, the sources of the third and fourth N-channel input MOSFETs being connected to the fourth constant current source, the drain of the third N-channel input MOSFET being connected to the drain of the third P-channel load MOSFET and the gates of the third and fourth P-channel load devices, the sources of the third and fourth P-channel load MOSFETs being connected to the first supply voltage conductor, the drain of the fourth P-channel load MOSFET being connected to the gate of the fourth N-channel input MOSFET and to the second control conductor, the gate of the third N-channel input MOSFET being connected to the first reference voltage conductor.

8. The class AB output stage of claim 7 wherein the first feedback circuit includes a first reference current source coupled to the drain of the first current sensing transistor and supplying a current equal to the first predetermined value, a first rectifying circuit coupled between the drain of the first current sensing transistor and the first control conductor, and wherein the second feedback circuit includes a second reference current source coupled to the drain of the second current sensing transistor and supplying a current equal to the second predetermined value, a second rectifying circuit coupled between the drain of the second current sensing transistor and the second control conductor.

9. The class AB output stage of claim 8 wherein the first rectifying circuit includes a P-channel MOSFET having a gate connected to the first reference conductor, a source connected to the drain of the first current sensing transistor, and a drain connected to the first control conductor, and wherein the second rectifying circuit includes a P-channel MOSFET having a gate connected to the second reference conductor, a source connected to the drain of the second current sensing transistor, and a drain connected to the second control conductor.

10. The class AB output stage of claim 7 wherein the first feedback circuit includes a first current limiting circuit coupled to the first current sensing transistor to limit current in the first sensing transistor, and the second feedback circuit includes a second current limiting circuit coupled to the second current sensing transistor to limit current in the second sensing transistor.

11. A class AB output stage, comprising:
(a) amplifying means for producing first and second output signals which incrementally increase and decrease in response to an incremental increase and decrease, respectively, of a first input signal, and which also incrementally increase and decrease in response to an incremental increase and decrease, respectively, of a second input signal;
(b) a pull-up transistor having a source coupled to a first supply voltage conductor, a gate coupled to receive the second output signal, and a drain coupled to an output terminal, and a pull-down transistor having a source coupled to a second supply voltage conductor, a gate coupled to receive the first output signal, and a drain coupled to the output terminal;
(c) a first feedback circuit including a first current sensing transistor having a gate and source connected to the gate and source, respectively, of the pull-down transistor and a drain coupled to a first control input of the amplifying means and operative to increase the gate voltage of the first current sensing transistor only until its drain current increases to a first predetermined value representative of a minimum desired quiescent current in the pull-down transistor; and
(d) a second feedback circuit including a second current sensing transistor having a gate and source connected to the gate and source, respectively, of the pull-up transistor, and a drain coupled to a second control input of the amplifying means and operative to decrease the gate voltage of the second current sensing transistor only until its drain current increases to a second predetermined value representative of a minimum desired quiescent current in the pull-up transistor.

12. A rail-to-rail class AB output circuit, comprising:
(a) an amplifying stage including first and second signal input conductors, first and second feedback input conductors, and first and second output conductors the amplifier stage including
  i. a first transistor having a source coupled by the first input conductor to a first constant current source, a drain coupled to the first output conductor, and a gate coupled to a first reference voltage,
  ii. a second transistor having a source coupled to the first input conductor, a drain coupled to the second output conductor, and a gate coupled to a first terminal of a first current control circuit,
  iii. a first V/I converter circuit coupled between the gates of the first and second transistors,
  iv. a third transistor having a source coupled by the second input conductor to a second constant current source, a drain coupled to the second output conductor, and a gate coupled to a second reference voltage,
  v. a fourth transistor having a source coupled to the second input conductor, a drain coupled to the first output conductor, and a gate coupled to a first terminal of a second current control circuit,
  vi. a second V/I converter circuit coupled between the gates of the third and fourth transistors;
(b) output circuitry including an output terminal, a pull-up transistor coupled between a first supply voltage conductor and the output terminal, a pull-down transistor coupled between the output terminal and a second supply voltage conductor, the pull-down transistor having a gate coupled to the first output conductor, the pull-up transistor having a gate coupled to the second output terminal;
(c) feedback circuitry coupled to the first and second feedback input conductors and the first and second output conductors to stabilize quiescent currents in the pull-up transistor and the pull-down transistor, the feedback circuitry including
  i. a first sensor transistor having a gate connected to the gate of the pull-down transistor, a source connected to the source of the pull-down transistor,
  ii. a first reference current source supplying a first reference current, the first reference current source having a terminal coupled to the drain of the first sensor transistor,
  iii. a first current control circuit having a terminal coupled to the drain of the first sensor transistor,
  iv. a second sensor transistor having a gate connected to the gate of the pull-up transistor, a source connected to the source of the pull-up transistor,
  v. a second reference current source supplying a second reference current, the second reference current source having a terminal coupled to the drain of the second sensor transistor,
  vi. a second current control circuit having a terminal coupled to the drain of the second sensor transistor, wherein the first current control circuit controls feedback from the first sensor transistor to reduce the turn-on voltage of the second transistor relative to the turn-on voltage of the first transistor if the drain current of the first sensor transistor is less than the first reference current to increase the turn-on voltage of the first sensor transistor until its drain current equals the first reference current, and wherein the second current control circuit controls feedback from the second sensor transistor to reduce the turn-on voltage of the fourth transistor relative to the turn-on voltage of the third transistor if the drain current of the second sensor transistor is less than the second reference current to increase the turn-on voltage of the second sensor transistor until its drain current equals the second reference current.

13. A rail-to-rail class AB output stage, comprising:

(a) an amplifying stage producing first and second output signals which both incrementally change in a common direction in response to an incremental change of a first input signal and which both also change in the common direction in response to an incremental change of a second input signal;

(b) a pull-up transistor having a first electrode coupled to a first supply voltage conductor, a control electrode coupled to receive the second output signal, and a second electrode coupled to an output terminal, and a pull-down transistor having a first electrode coupled to a second supply voltage conductor, a control electrode coupled to receive the first output signal, and a second electrode coupled to the output terminal; and (c) a first feedback circuit including a first current sensing transistor having a control electrode and first electrode connected to the control electrode and first electrode, respectively, of the pull-down transistor and a second electrode coupled to a first control input of the amplifying stage and operative to increase the control electrode voltage of the first current sensing transistor only until its second electrode current increases to a first predetermined value representative of a minimum desired quiescent current in the pull-down transistor, and a second feedback circuit including a second current sensing transistor having a control electrode and first electrode connected to the control electrode and first electrode, respectively, of the pull-up transistor, and a second electrode coupled to a second control input of the amplifying stage and operative to decrease the control electrode voltage of the second current sensing transistor only until its second electrode current increases to a second predetermined value representative of a minimum desired quiescent current in the pull-up transistor.

14. An operational amplifier comprising:

(a) a front end circuit including an input stage receiving an input signal and producing complementary first and second output signals in response to the input signal; and (b) a rail-to-rail class AB output stage including i. an amplifying stage producing third and fourth output signals which incrementally increase and decrease in response to an incremental increase and decrease, respectively, of the first output signal, and which also incrementally increase and decrease in response to an incremental increase and decrease, respectively, of the second output signal, ii. a pull-up transistor having a first electrode coupled to a first supply voltage conductor, a control electrode coupled to receive the fourth output signal, and a second electrode coupled to an output terminal, and a pull-down transistor having a first electrode coupled to a second supply voltage conductor, a control electrode coupled to receive the third output signal, and a second electrode coupled to the output terminal, and iii. a first feedback circuit including a first current sensing transistor having a control electrode and first electrode connected to the control electrode and first electrode, respectively, of the pull-down transistor and a second electrode coupled to a first control input of the amplifying stage and operative to increase the control electrode voltage of the first current sensing transistor only until its second electrode current increases to a first predetermined value representative of a minimum desired quiescent current in the pull-down transistor, and a second feedback circuit including a second current sensing transistor having a control electrode and first electrode connected to the control electrode and first electrode, respectively, of the pull-up transistor, and a second electrode coupled to a second control input of the amplifying stage and operative to decrease the control electrode voltage of the second current sensing transistor only until its second electrode current increases to a second predetermined value representative of a minimum desired quiescent current in the pull-up transistor.

15. A method of providing rail-to-rail operations of a class AB output stage, comprising:

(a) producing first and second output signals which both incrementally change in a common direction by amplifying an incremental change of a first input signal and/or amplifying an incremental change of a second input signal;

(b) applying the second output signal to a control electrode of a pull-up transistor having a first electrode coupled to a first supply voltage conductor and a second electrode coupled to an output terminal, and applying the second output signal to a control electrode of a pull-down transistor having a first electrode coupled to a second supply voltage conductor and a second electrode coupled to the output terminal; and (c) operating a first feedback circuit including a first current sensing transistor having a control electrode and first electrode connected to the control electrode and first electrode, respectively, of the pull-down transistor and a second electrode coupled to a first control input of the amplifying stage to increase the control electrode voltage of the first current sensing transistor only until its second electrode current increases to a first predetermined value representative of a minimum desired quiescent current in the pull-down transistor, and operating a second feedback circuit including a second current sensing transistor having a control electrode and first electrode connected to the control electrode and first electrode, respectively, of the pull-up transistor, and a second electrode coupled to a second control input of the amplifying stage to decrease the control electrode voltage of the second current sensing transistor only until its second electrode current increases to a second predetermined value representative of a minimum desired quiescent current in the pull-up transistor.

* * * * *